US010745824B2

United States Patent
Suzuki et al.

(10) Patent No.: US 10,745,824 B2
(45) Date of Patent: Aug. 18, 2020

(54) FILM FORMING APPARATUS

(71) Applicant: NUFLARE TECHNOLOGY, INC., Yokohama-shi, Kanagawa (JP)

(72) Inventors: Kunihiko Suzuki, Shizuoka (JP); Naohisa Ikeya, Kanagawa (JP); Masayoshi Yajima, Kanagawa (JP); Kazukuni Hara, Aichi (JP); Hiroaki Fujibayashi, Aichi (JP); Hideki Matsuura, Aichi (JP); Katsumi Suzuki, Aichi (JP)

(73) Assignee: NuFlare Technology, Inc., Yokohama-shi, Kanagawa (JP)

( * ) Notice: Subject to any disclaimer, the term of this patent is extended or adjusted under 35 U.S.C. 154(b) by 210 days.

(21) Appl. No.: 15/813,709

(22) Filed: Nov. 15, 2017

(65) Prior Publication Data

US 2018/0135203 A1   May 17, 2018

(30) Foreign Application Priority Data

Nov. 16, 2016   (JP) .................................. 2016-223573

(51) Int. Cl.
*C23C 16/40* (2006.01)
*C30B 25/10* (2006.01)
*C23C 16/46* (2006.01)
*C30B 25/14* (2006.01)
(Continued)

(52) U.S. Cl.
CPC .......... *C30B 25/10* (2013.01); *C23C 16/4411* (2013.01); *C23C 16/45561* (2013.01);
(Continued)

(58) Field of Classification Search
CPC ....... C30B 25/10; C30B 25/165; C30B 29/36; C30B 25/14; C23C 16/45582;
(Continued)

(56) References Cited

U.S. PATENT DOCUMENTS 5,616,208 A    4/1997  Lee
5,647,945 A *  7/1997  Matsuse .................... C23C 8/06
                                                    156/345.38

(Continued)

FOREIGN PATENT DOCUMENTS

JP        5-343331       12/1993
JP        H7-94489 A      4/1995
(Continued)

OTHER PUBLICATIONS

Notice of Reasons for Refusal issued by the Japanese Patent Office dated Nov. 1, 2019, for Japanese Patent Application No. 2016-223573.
(Continued)

*Primary Examiner* — Rudy Zervigon
(74) *Attorney, Agent, or Firm* — Finnegan, Henderson, Farabow, Garrett & Dunner, L.L.P.

(57) ABSTRACT

A film forming apparatus according to an embodiment includes: a film forming chamber configured to house therein a substrate to perform film forming processing; a gas supplier located in an upper part of the film forming chamber and configured to supply a process gas onto the substrate; and a heater configured to heat the substrate, wherein the film forming chamber has a temperature-increase suppression region being a lower part of the gas supplier and suppressing a temperature increase of the gas supplied to an upper part of the heater.

16 Claims, 7 Drawing Sheets

(51) Int. Cl.
    *C23C 16/52*         (2006.01)
    *C23C 16/455*      (2006.01)
    *C30B 25/16*        (2006.01)
    *C30B 29/36*        (2006.01)
    *C23C 16/44*        (2006.01)

(52) U.S. Cl.
    CPC .. *C23C 16/45563* (2013.01); *C23C 16/45565* (2013.01); *C23C 16/45574* (2013.01); *C23C 16/45582* (2013.01); *C23C 16/45585* (2013.01); *C23C 16/46* (2013.01); *C23C 16/52* (2013.01); *C30B 25/14* (2013.01); *C30B 25/165* (2013.01); *C30B 29/36* (2013.01)

(58) Field of Classification Search
    CPC ........... C23C 16/4411; C23C 16/45561; C23C 16/45585; C23C 16/45574; C23C 16/45565; C23C 16/46; C23C 16/52; C23C 16/45563
    USPC ................ 118/715, 724; 156/345.33, 345.34
    See application file for complete search history.

(56) References Cited

U.S. PATENT DOCUMENTS 5,935,337 A * 8/1999 Takeuchi .......... C23C 16/45565
                                                  118/724

9,598,792 B2     3/2017   Suzuki et al.
2012/0325138 A1* 12/2012   Suzuki .................. C30B 25/10
                                            117/88

FOREIGN PATENT DOCUMENTS

| JP | H11-204443 A | 7/1999 |
| JP | 2002-16008 | 1/2002 |
| JP | 2009-111220 | 5/2009 |
| JP | 2010-59520 A | 3/2010 |
| JP | 2011-233777 | 11/2011 |
| JP | 2013-30758 A | 2/2013 |
| JP | 2013-93514 A | 5/2013 |
| JP | 2014-145111 | 8/2014 |
| JP | 2015-142038 | 8/2015 |

OTHER PUBLICATIONS

First Office Action issued by The State Intellectual Property Office of People's Republic of China dated Dec. 4, 2019, for Chinese Patent Application No. 201711130148.7.
Notice of Reasons for Refusal issued by the Japanese Patent Office on Jan. 24, 2020, in Japanese Patent Application No. 2016-223573.
The Second Office Action issued by the State Intellectual Property Office of People's Republic of China dated Jun. 2, 2020, for Chinese Application No. 201711130148.7.

* cited by examiner

FILM FORMING APPARATUS

CROSS REFERENCE TO RELATED APPLICATIONS

This application is based upon and claims the benefit of priority from the prior Japanese Patent Application No. 2016-223573, filed on Nov. 16, 2016, the entire contents of which are incorporated herein by reference.

FIELD

The embodiments of the present invention relate to a film forming apparatus.

BACKGROUND

An epitaxial growth technique that enables to form a film by vapor-depositing a single crystal thin film on a substrate is conventionally used at a manufacturing step of a semiconductor element that requires a crystal film with a relatively large thickness, as a power device such as an IGBT (Insulated Gate Bipolar Transistor).

In a film forming apparatus used for the epitaxial growth technique, a substrate is placed inside a film forming chamber that is kept at a normal pressure or a reduced pressure and a source gas and a doping gas are supplied into the film forming chamber while the substrate is rotated and heated. Accordingly, a pyrolytic reaction and a hydrogen reduction reaction of the source gas occur on the surface of the substrate and an epitaxial film is formed on the substrate.

The source gas and the doping gas are introduced from a gas supplier that is provided in an upper part of the film forming apparatus. However, if the source gas or the doping gas stays near a supply port of the gas supplier and is heated, a source or a dopant adheres to the surface of the gas supplier. If the source or the dopant having adhered to the gas supplier becomes particles and falls on the substrate, a defect may occur. Furthermore, the dopant having adhered to the gas supplier gasifies in the film forming chamber even when the gases in the film forming chamber are discharged or the film forming chamber is purged. In this case, discharge of the gases or purge of the film forming chamber takes a long time.

SUMMARY

A film forming apparatus according to an embodiment includes: a film forming chamber configured to house therein a substrate to perform film forming processing; a gas supplier located in an upper part of the film forming chamber and configured to supply a process gas onto the substrate; and a heater configured to heat the substrate, wherein the film forming chamber has a temperature-increase suppression region being a lower part of the gas supplier and suppressing a temperature increase of the gas supplied to an upper part of the heater.

The apparatus may further include a first cooler located on a first sidewall part of the film forming chamber around the temperature-increase suppression region, and configured to suppress a temperature increase of the gas in the temperature-increase suppression region using a refrigerant.

An inside diameter of the first sidewall part of the film forming chamber around the temperature-increase suppression region may be smaller than that of a second sidewall part of the film forming chamber below the first sidewall part, the apparatus may further include a reflector located at a stepped portion between the first sidewall part and the second sidewall part and configured to reflect heat from the heater, and the reflector may be protruded from the first sidewall part toward an inner side of the film forming chamber.

A step may be provided between the first sidewall part and the second sidewall part.

The gas supplier may include a plurality of nozzles arranged substantially uniformly in a concentric manner in a plane substantially perpendicular to a gas supply direction.

Nozzles supplying a source gas and nozzles supplying a doping gas among the nozzles may be arranged alternately and substantially uniformly in the gas supplier.

The gas supplier may further include an orifice portion located on a side face of each of nozzles of the gas supplier and protruded in a direction substantially perpendicular to a gas supply direction.

The gas supplier may supply a mixture gas obtained by mixing in advance at least two out of a plurality of source gases constituting the process gas to the film forming chamber.

The gas supplier may include: at least one flow rate controller configured to determine a flow rate of the process gas, at least one first nozzle each configured to supply the process gas at a predetermined flow rate to the film forming chamber using the flow rate controller, and a second nozzle configured to supply a remaining part of the process gas not having been supplied to the first nozzle to the film forming chamber.

When number of the first and second nozzles may be n (n is an integer equal to or larger than 2), number of the flow rate controllers provided for the first and second nozzles is n−1.

The gas supplier may change a flow rate of the process gas according to a distance from a center of the substrate.

The gas supplier changes a concentration of the process gas for each of concentric circles of the nozzles.

DETAILED DESCRIPTION

Embodiments will now be explained with reference to the accompanying drawings. The present invention is not limited to the embodiments.

First Embodiment

Figure 1:
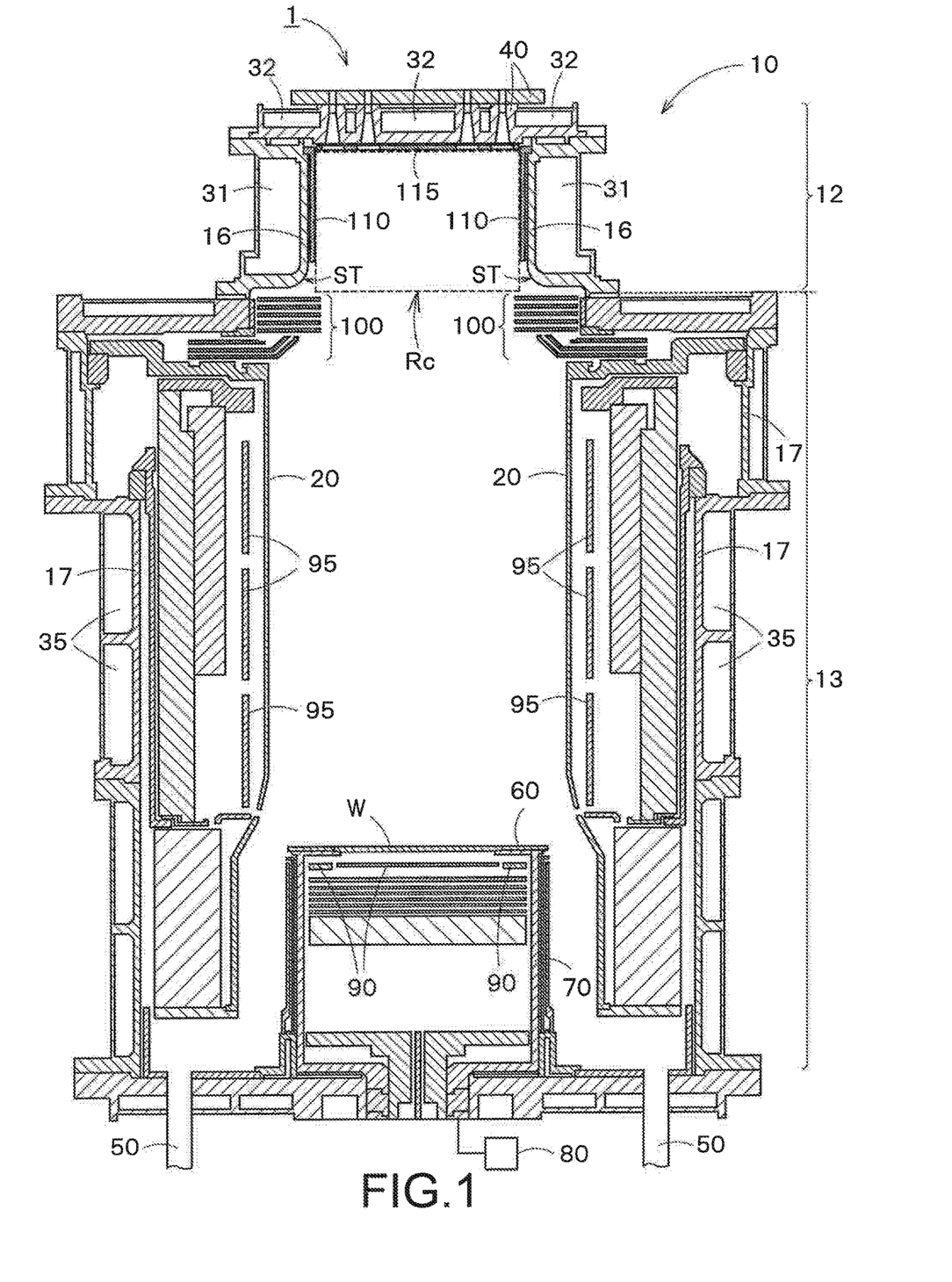
FIG. 1 is a sectional view illustrating a configuration example of a film forming apparatus 1 according to a first embodiment.

FIG. 1 is a sectional view illustrating a configuration example of a film forming apparatus 1 according to a first embodiment. The film forming apparatus 1 includes a chamber 10, a liner 20, first, second, and third coolers 31, 32, and 35, a gas supplier 40, a discharge part 50, a susceptor 60, a support part 70, a rotation mechanism 80, a lower heater 90, an upper heater 95, and a reflector 100.

The chamber 10 serving as a film forming chamber can house a substrate W therein and is made of, for example, stainless steel. The inside of the chamber 10 is depressurized by a vacuum pump (not illustrated). The chamber 10 has a head part 12 and a body part 13. The gas supplier 40, the first cooler 31, and the second cooler 32 are provided in the head part 12. A process gas containing a source gas, a carrier gas, and a doping gas supplied from the gas supplier 40 is suppressed in the temperature increase by the first cooler 31 and the second cooler 32 in the inner part of the chamber 10 at the head part 12. A region in which the temperature increase of the gases is suppressed in the inner part of the head part 12 of the chamber 10 is thus hereinafter referred to as "temperature-increase suppression region Rc".

The susceptor 60, the rotation mechanism 80, the lower heater 90, the upper heater 95, and the like are placed in the inner part of the chamber 10 at the body part 13. The gases supplied from the gas supplier 40 are heated in the inner part of the body part 13 and react on the surface of the substrate W. Accordingly, a material film is epitaxially grown on the substrate W. The material film is, for example, a SiC film.

The inside diameter of the head part 12 of the chamber 10 is smaller than that of the body part 13. Therefore, the inside diameter of a first sidewall part 16 of the head part 12 is smaller than that of a second sidewall part 17 of the body part 13 and thus a step ST is provided between the head part 12 and the body part 13. The reflector 100, the liner 20, and the like are provided under the step ST.

The liner 20 is a hollow tubular member that covers and protects the inner wall of the chamber 10 and is, for example, made of carbon. The liner 20 covers the upper heater 95 to suppress a material film from being formed on the upper heater 95.

The first cooler 31 and the second cooler 32 are provided in the head part 12 of the chamber 10 and, for example, constitute a flow channel of a refrigerant (water, for example). With the refrigerant flowing through the flow channel, the first cooler 31 and the second cooler 32 suppress the temperature increase of the gases in the temperature-increase suppression region Rc. The first cooler 31 and the second cooler 32 are also provided around nozzles of the gas supplier 40. This enables the gases supplied to the temperature-increase suppression region Rc to be cooled. Along therewith, the first cooler 31 and the second cooler 32 prevent the head part 12 of the chamber 10 from being heated by heat from the upper heater 95 or the lower heater 90.

The third cooler 35 is provided in the body part 13 of the chamber 10 and, for example, constitutes a flow channel of a refrigerant (water, for example) similarly to the first cooler 31 and the second cooler 32. However, the third cooler 35 is provided to prevent the body part 13 of the chamber 10 from being heated by heat from the upper heater 95 or the lower heater 90, not to cool the space in the body part 13.

The gas supplier 40 is placed on the top face of the chamber 10 opposed to the surface of the substrate W and has a plurality of nozzles. The gas supplier 40 supplies the source gas, the doping gas, and the carrier gas to the temperature-increase suppression region Rc in the inner part of the chamber 10 through the nozzles. A more detailed configuration of the gas supplier 40 is explained later with reference to FIG. 2.

The discharge part 50 is provided at the bottom of the chamber 10 and discharges the gases having been used for film forming processing out of the chamber 10.

The susceptor 60 is an annular member on which the substrate W can be mounted and is, for example, made of carbon. The support part 70 is a cylindrical member that can support the susceptor 60 and is, for example, made of carbon similarly to the susceptor 60. The support part 70 is connected to the rotation mechanism 80 and is configured to be rotated by the rotation mechanism 80. The support part 70 can rotate the substrate W together with the susceptor 60. The susceptor 60 and the support part 70 can be made of a material having a heat resistance to a temperature equal to or higher than 1700° C., such as SiC (silicon carbide), TaC (tantalum carbide), W (tungsten), or Mo (molybdenum) as well as carbon.

The lower heater 90 is placed below the susceptor 60 and the substrate W and in the inner part of the support part 70. The lower heater 90 heats the substrate W from below. The upper heater 95 is provided along the side face of the body part 13 of the chamber 10 and heats the inner part of the body part 13. The upper heater 95 is placed below the step ST of the chamber 10 so as not to directly heat the temperature-increase suppression region Rc. While the rotation mechanism 80 rotates the substrate W at a high speed such as 900 rpm or faster, the lower heater 90 and the upper heater 95 heat the substrate W to a high temperature equal to or higher than 1500° C. In this way, the substrate W can be heated uniformly.

The reflector 100 is provided between the head part 12 and the body part 13 in the chamber 10 and is, for example, made of carbon. The reflector 100 reflects heat from the lower heater 90 and the upper heater 95 downward. The temperature in the temperature-increase suppression region Rc is thus prevented from being excessively increased due to heat from the lower heater 90 and the upper heater 95. For example, the reflector 100 functions to cause the temperature in the temperature-increase suppression region Rc to be lower than the reaction temperature of the source gas along with the first cooler 31 and the second cooler 32. The reflector 100 can be made of a material having a heat resistance to a temperature equal to or higher than 1700° C., such as SiC (silicon carbide), TaC (tantalum carbide), W (tungsten), or Mo (molybdenum) as well as carbon. Although the reflector 100 can be a single thin plate, the reflector 100 preferably has a structure in which a plurality of thin plates are located away from each other by an appropriate distance to reflect heat efficiently.

The film forming apparatus 1 can further include protection covers 110 and 115. The protection covers 110 and 115 are provided to cover the surface of the gas supplier 40 or the inner wall face (SF12 in FIG. 2) of the chamber 10.

Figure 2:
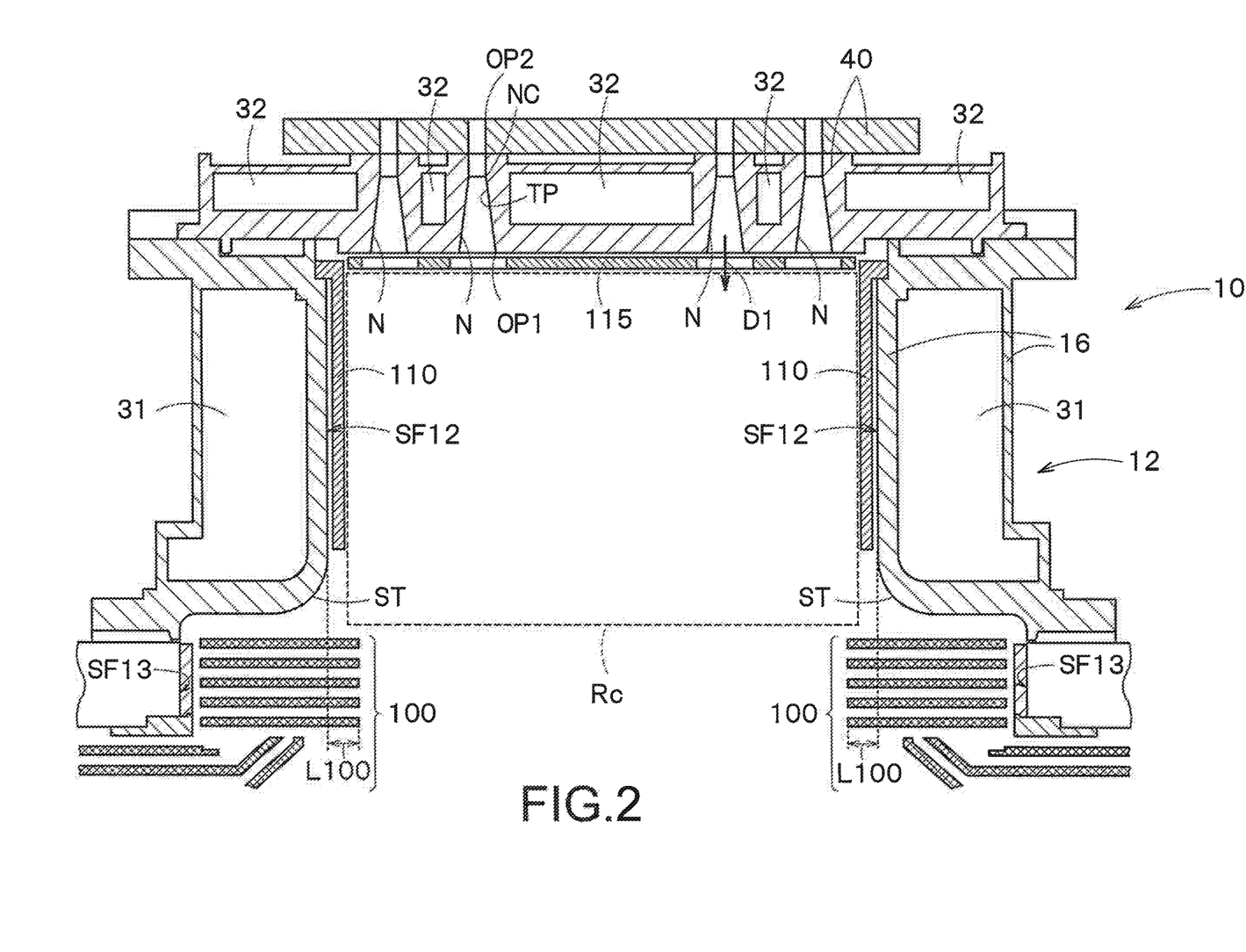
FIG. 2 is a sectional view illustrating a configuration example of the head part 12 of the chamber 10.

FIG. 2 is a sectional view illustrating a configuration example of the head part 12 of the chamber 10. The gas supplier 40 has a plurality of nozzles N. The nozzles N are provided to eject the source gas, the doping gas, and the carrier gas toward the surface of the substrate W placed on the susceptor 60 in the chamber 10 in a direction D1 substantially perpendicular to the surface of the substrate W (that is, in a substantially vertical direction). The nozzles N introduce the source gas, the doping gas, and the carrier gas from outside the chamber 10 to the temperature-increase suppression region Rc in the chamber 10.

As illustrated in FIG. 2, at least a part of the side face of each of the nozzles N in a cross-section in the gas supply direction D1 is inclined with respect to the gas supply direction D1. That is, at least a part of the side face of each of the nozzles N has a taper. For example, each of the nozzles N has a taper TP on a side face from an intermediate part Nc of the nozzle to a first opening part OP1. The first opening part OP1 is located on an inner side of the chamber 10 and is an opening of the nozzle N for ejecting the corresponding gas. A second opening part OP2 is located on an outer side of the chamber 10 and is an opening of the nozzle N for taking in the corresponding gas. The intermediate part Nc can be at any position between the first opening part OP1 and the second opening part OP2. Due to these tapers TP of the nozzles N near the respective first opening parts OP1, the gases can be supplied uniformly onto the surface of the substrate W.

The chamber 10 has the temperature-increase suppression region Rc under the gas supplier 40, in which the temperature increase of the gases is suppressed. The temperature-increase suppression region Rc is an internal space of the head part 12 of the chamber 10 and is provided to suppress the temperature increase of the gases introduced from the nozzles N. The first cooler 31 is provided on the first sidewall part 16 of the chamber 10 around the temperature-increase suppression region Rc. The first cooler 31 uses a refrigerant (water, for example) to suppress the temperature increase of the gases in the temperature-increase suppression region Rc via the first sidewall part 16. The second cooler 32 is further provided in the gas supplier 40 located in the upper part of the chamber 10. The second cooler 32 also uses a refrigerant (water, for example) to cool the temperature-increase suppression region Rc via the gas supplier 40. The second cooler 32 is provided around the nozzles N and cools also the gases passing through the nozzles N.

Accordingly, the temperature increase of the source gas, the doping gas, and the carrier gas is suppressed in the temperature-increase suppression region Rc in the head part 12 of the chamber 10. For example, when a SIC film is to be formed, the gas supplier 40 supplies a silane gas and a propane gas as the source gas into the chamber 10. For example, when a P-type SiC film is to be formed, the gas supplier 40 supplies a TMA (Tri-Methyl-Aluminum) gas as the doping gas into the chamber 10. Hydrogen or argon is used, for example, as the carrier gas. The temperature-increase suppression region Rc is cooled to a temperature lower than the reaction temperature (400° C., for example) of the silane gas and the propane gas. Accordingly, adhesion of a material film such as a SiC film to the inner wall of the head part 12 of the chamber 10 or the inner wall of the gas supplier 40 can be suppressed. The temperature increase suppression includes also suppression in the degree of the temperature increase (the increase ratio) of the gases, as well as reduction in the temperature of the gases. Therefore, even if the gas temperature increases in the temperature-increase suppression region Rc, it is adequate when the temperature increase ratio is lower than that in a case where the temperature-increase suppression region Rc is not provided.

Meanwhile, for example, the lower heater 90 and the upper heater 95 heat the substrate W to a high temperature equal to or higher than 1500° C. The gas supplier 40 supplies the silane gas, the propane gas, and the TMA gas to the surface of the heated substrate W. Accordingly, the silane gas and the propane gas react on the surface of the substrate W and a SiC film is epitaxially grown on the surface of the substrate W. At this time, TMA is doped as a dopant into the SiC film, whereby a P-type SiC film is formed.

The reflector 100 is provided to prevent the temperature in the temperature-increase suppression region Rc from being increased to be higher than the reaction temperature of the source gas due to the heat of the upper heater 95 and the lower heater 90. The reflector 100 is provided just under the stepped portion ST between the inner side face SF12 of the head part 12 of the chamber 10 and an inner side face SF13 of the body part 13. That is, the reflector 100 is provided between the first cooler 31 and the upper heater 95. Accordingly, the reflector 100 can reflect heat from the lower heater 90 and the upper heater 95 downward. Furthermore, the reflector 100 is protruded from the first sidewall part 16 of the head part 12 to the inner side of the chamber 10 by a length L100. This enables the reflector 100 to reflect heat from the lower heater 90 and the upper heater 95 downward more efficiently and to further suppress the temperature increase in the temperature-increase suppression region Rc.

Figure 3:
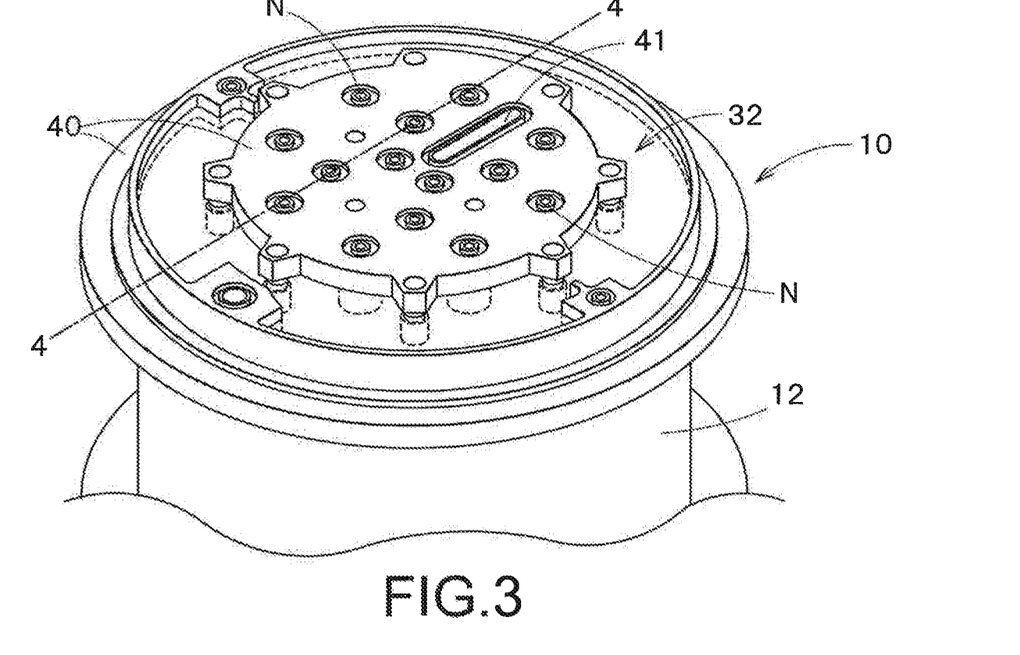
FIG. 3 is a perspective view illustrating an internal configuration of the head part 12 of the chamber 10 and the gas supplier 40.
Figure 4:
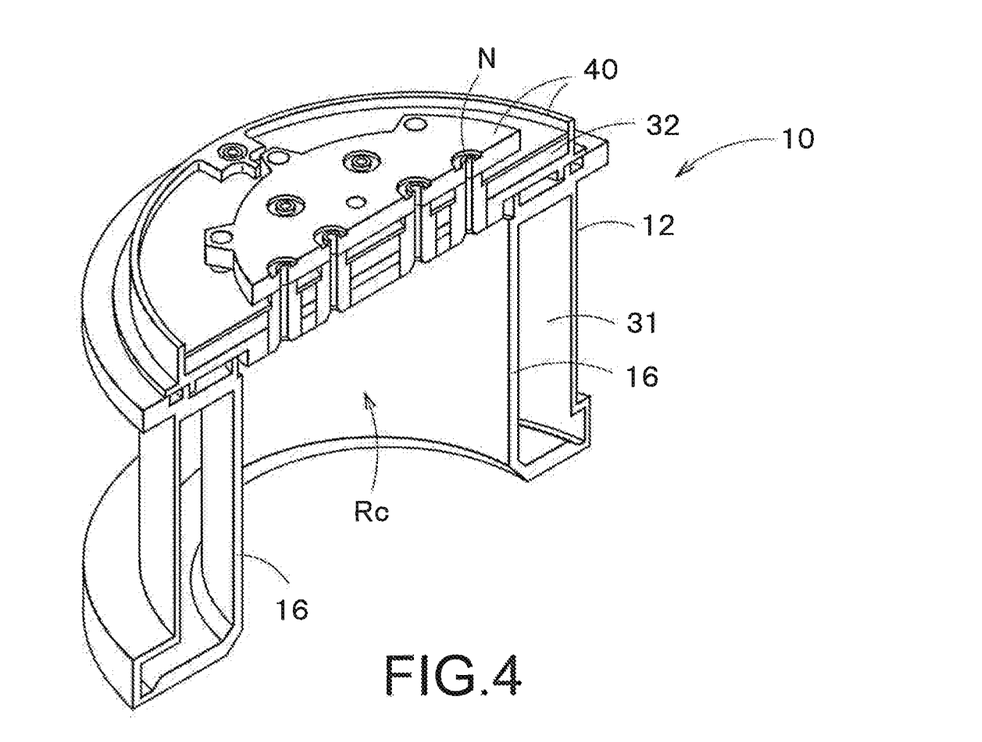
FIG. 4 is a sectional view along a line 4-4 in FIG. 3.

FIG. 3 is a perspective view illustrating an internal configuration of the head part 12 of the chamber 10 and the gas supplier 40. FIG. 4 is a sectional view along a line 4-4 in FIG. 3.

As illustrated in FIG. 3, the gas supplier 40 includes the nozzles N. The second cooler 32 is provided around the nozzles N in the gas supplier 40. The second cooler 32 has a space or a flow channel to enable a refrigerant such as water to be stored therein or flow therethrough. The gas supplier 40 has also a temperature measuring window 41 to measure the temperature of the substrate W, as well as the nozzles N. A radiation thermometer (not illustrated) is placed above the temperature measuring window 41 and the radiation thermometer measures a surface temperature of the substrate W through the temperature measuring window 41. Temperature data of the substrate W is fed back to the lower heater 90 and the upper heater 95 to enable the substrate W to be kept at a desired temperature.

As illustrated in FIG. 4, the first cooler 31 is provided on the first sidewall part 16 of the head part 12 of the chamber 10. The first cooler 31 has a space or a flow channel to enable a refrigerant such as water to be stored therein or flow therethrough.

As described above, the film forming apparatus 1 according to the present embodiment has the temperature-increase suppression region Rc just under the gas supplier 40 of the chamber 10, in which the temperature increase of the gases is suppressed. The temperature increase in the temperature-increase suppression region Rc is suppressed by the first cooler 31 and the second cooler 32 provided in the head part 12 of the chamber 10 and the gas supplier 40. Therefore, the source gas and the doping gas do not react in the temperature-increase suppression region Rc and adhesion of an epitaxial film to the inner wall of the head part 12 of the chamber 10 and the inner wall of the gas supplier 40 can be suppressed.

Meanwhile, the lower heater 90 and the upper heater 95 are provided in the body part 13 to enable the source gas and the doping gas to be rapidly heated. Accordingly, a material film can be epitaxially grown on the surface of the substrate W placed in the body part 13.

The diameter of the first sidewall part 16 of the head part 12 is smaller than that of the second sidewall part 17 of the body part 13 and the step ST is provided therebetween. The upper heater 95 is provided below the step ST and is configured not to directly heat the temperature-increase suppression region Rc. Furthermore, the reflector 100 is provided on the step ST. The reflector 100 reflects heat from the lower heater 90 and the upper heater 95 downward to further suppress heating of the temperature-increase suppression region Rc.

A film forming method according to the present embodiment is briefly explained next.

First, a substrate W is carried into the chamber 10 and is placed on the susceptor 60.

Next, the substrate W is heated using the upper heater 95 and the lower heater 90 at a rate about 150° C./minute to reach 1500° C. or a higher temperature.

Subsequently, the rotation mechanism 80 rotates the substrate W and the gas supplier 40 supplies the source gas (the silane gas and the propane gas, for example) and the doping gas (the TMA gas, for example) into the chamber 10. A material film (a SIC epitaxial film, for example) is thus formed on the substrate W. At this time, an epitaxial film or a dopant hardly adheres to the inner wall of the head part 12 of the chamber 10 and the gas supplier 40 because the temperature-increase suppression region Rc is provided below the gas supplier 40.

Meanwhile, the lower heater 90 and the upper heater 95 are provided in the body part 13 and heat the source gas and the doping gas to a temperature equal to or higher than 1500° C. Accordingly, a uniform material film can be epitaxially grown on the surface of the substrate W placed in the body part 13.

The temperature in the inner part of the chamber 10 is thereafter lowered and a purge gas is supplied therein. The substrate W is then carried out of the chamber 10.

Second Embodiment

Figure 5:
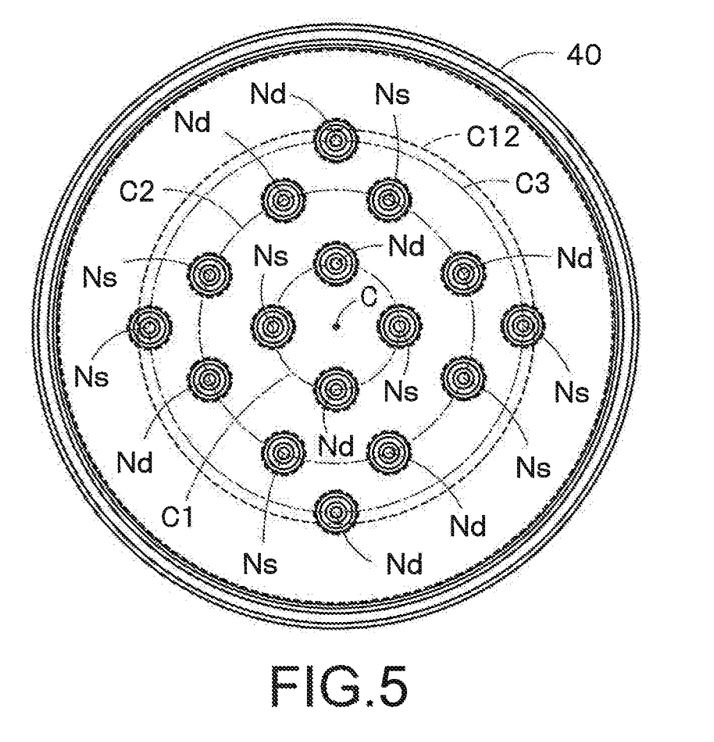
FIG. 5 is a plan view illustrating a placement example of the nozzles N of the gas supplier 40 according to a second embodiment.

FIG. 5 is a plan view illustrating a placement example of the nozzles N of the gas supplier 40 according to a second embodiment. Nozzles Ns are nozzles that supply the source gas, and nozzles Nd are nozzles that supply the doping gas. A dashed circle C12 indicates the position of the inner side face SF12 of the head part 12 of the chamber 10. Most of the nozzles Ns and Nd are placed on the inner side of the dashed circle C12 and are placed substantially uniformly on concentric circles C1 to C3 having a center C of the dashed circle C12 as a common center. As viewed from above the surface of the substrate W, the center C is the center of the substrate W. Among the concentric circles C1 to C3, the concentric circle C1 is the closest to the center C of the substrate W, the concentric circle C2 is the second closest to the center C, and the concentric circle C3 is the farthest from the center C. The concentric circles C1 to C3 are virtual circles and are not actually drawn on the gas supplier 40. The number of the concentric circles is not particularly limited.

The nozzles Ns and the nozzles Nd are provided to be the same in the number and are placed alternately and substantially uniformly. For example, two nozzles Ns and two nozzles Nd are arrayed on the concentric circle C1 alternately and substantially uniformly. The distances between adjacent nozzles Ns and Nd on the concentric circle C1 are all equal. Four nozzles Ns and four nozzles Nd are arrayed on the concentric circle C2 alternately and substantially uniformly. The distances between adjacent nozzles Ns and Nd on the concentric circle C2 are all equal. Furthermore, two nozzles Ns and two nozzles Nd are arrayed on the concentric circle C3 alternately and substantially uniformly. The distances between adjacent nozzles Ns and Nd on the concentric circle C3 are all equal. In this way, the nozzles Ns and the nozzles Nd are provided to be the same in the number within the concentric circle C12 and are placed on the concentric circles alternately and substantially uniformly. Accordingly, the nozzles Ns and Nd are provided at substantially even densities in the gas supplier 40 and can supply both the source gas and the doping gas substantially uniformly into the temperature-increase suppression region Rc in the chamber 10. The numbers of the nozzles Ns and Nd provided in the gas supplier 40 are not particularly limited. The number of nozzles provided correspondingly to each of the concentric circles C1 to C3 is not particularly limited.

Flow rates of the source gas and the doping gas can be changed for each of the concentric circles C1 to C3. For example, the flow rates of the source gas and the doping gas can be large near the center C and the flow rates of the source gas and the doping gas can be decreased as the distance from the center C increases.

Figure 6:
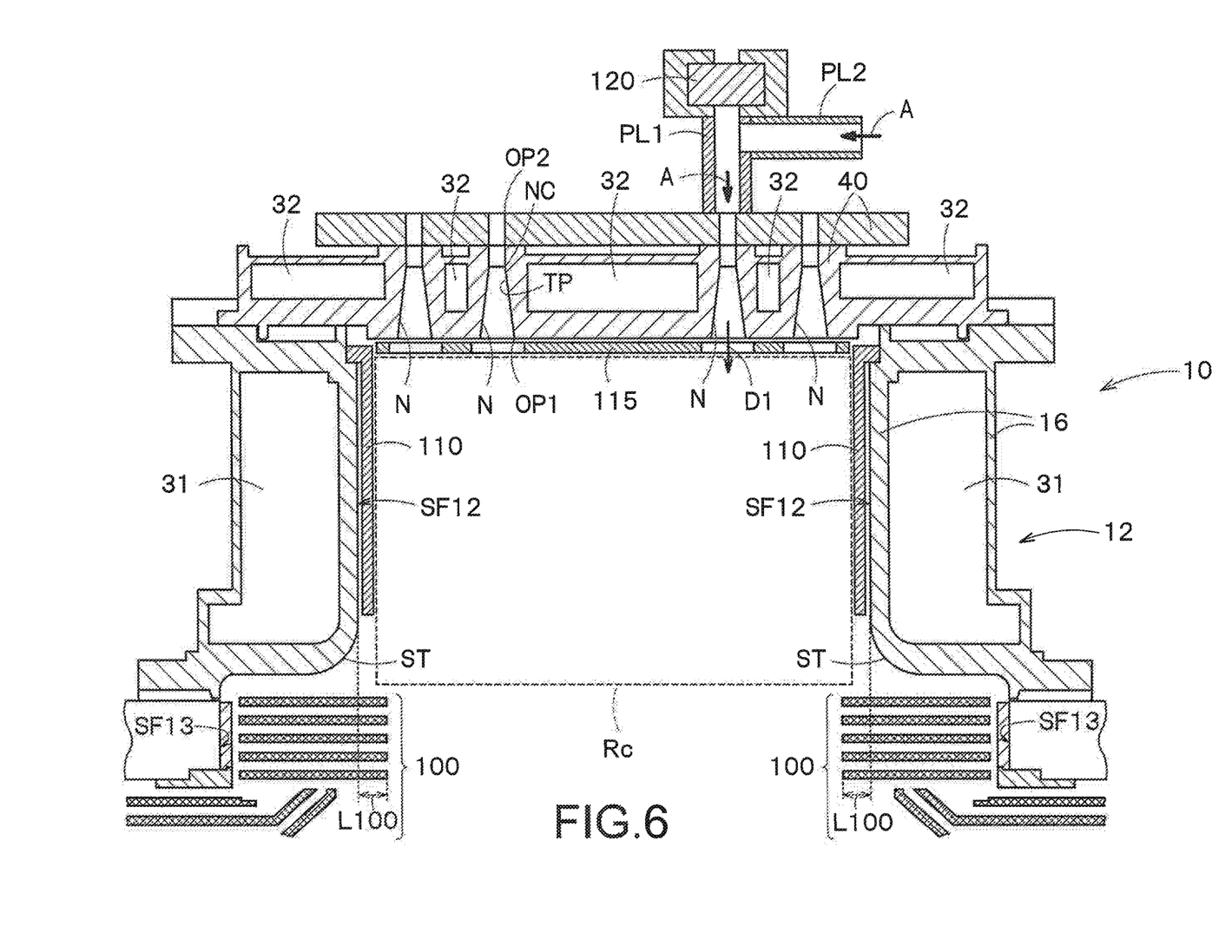
FIG. 6 is a sectional view illustrating a configuration example of the film forming apparatus 1 in which a temperature measuring window 120 is attached to one of the nozzles N in the gas supplier 40.

According to the second embodiment, a window dedicated for temperature measuring is not provided in the gas supplier 40. A temperature measuring window is externally attached to any of the nozzles Ns and Nd. A radiation thermometer measures the surface temperature of the substrate W through the nozzle to which the temperature measuring window is attached. For example, FIG. 6 is a sectional view illustrating a configuration example of the film forming apparatus 1 in which a temperature measuring window 120 is attached to one of the nozzles N in the gas supplier 40. The temperature measuring window 120 is attached to the second opening part OP2 of one nozzle N via a pipe PL1. A radiation thermometer (not illustrated) measures the surface temperature of the substrate W in the chamber 10 through the pipe PL1 and the nozzle N. The pipe PL1 is communicated with a pipe PL2 separately from the temperature measuring window 120 and can introduce the gas into the chamber 10 as indicated by arrows A without interfering with the flow of the gas. In this way, according to the second embodiment, the window dedicated for temperature measuring is not provided in the gas supplier 40 and thus the flexibility in the number and arrangement of the nozzles Ns and Nd is increased.

Third Embodiment

Figure 7:
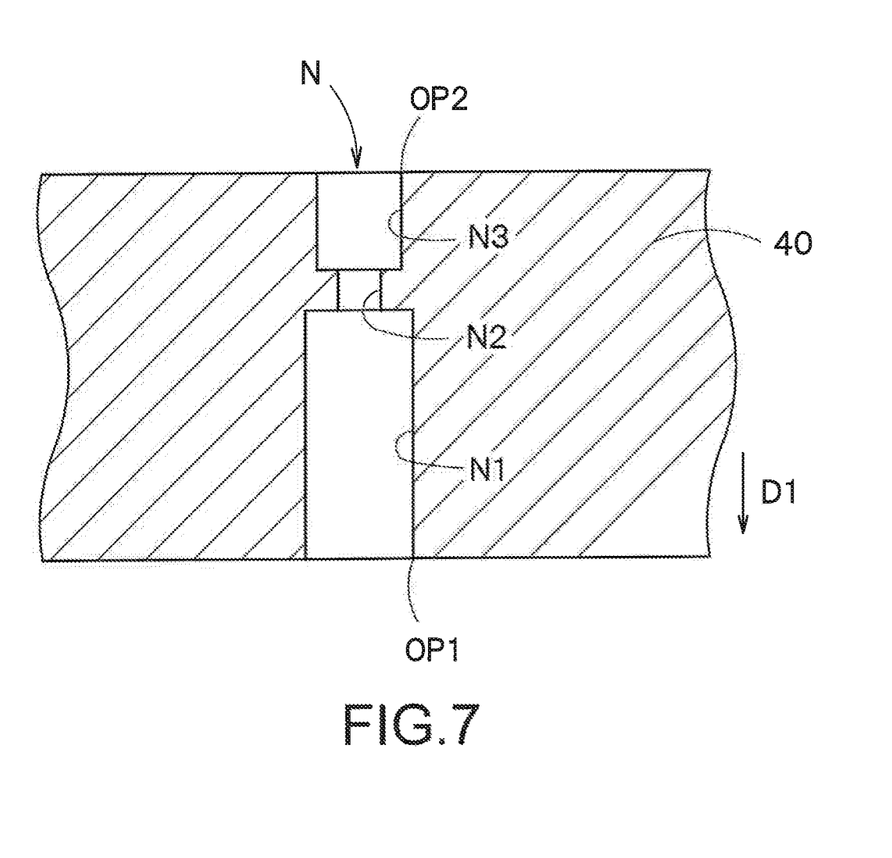
FIG. 7 is a sectional view illustrating an example of the shape of the nozzles N according to a third embodiment.

FIG. 7 is a sectional view illustrating an example of the shape of the nozzles N according to a third embodiment. The nozzles N illustrated in FIGS. 1 and 2 have the taper TP. However, the nozzles N according to the third embodiment do not have a taper as illustrated in FIG. 7.

The nozzle N illustrated in FIG. 7 includes a first nozzle portion N1, a second nozzle portion N2, and a third nozzle portion N3. The first to third nozzle portions N1 to N3 are provided from the first opening part OP1 to the second opening part OP2 in this order. The side faces of the first to third nozzle portions N1 to N3 are all provided to be substantially parallel to the gas supply direction D1. The planar shapes of the first to third nozzle portions N1 to N3 can all be substantially circular.

The first nozzle portion N1 is communicated with the temperature-increase suppression region Rc of the chamber 10 and has a larger diameter than those of the second and third nozzle portions N2 and N3. The diameter of the first nozzle portion N1 is, for example, about 10 to 20 millimeters.

The second nozzle portion N2 is provided between the first nozzle portion N1 and the third nozzle portion N3 and has a diameter smaller than both the diameters of the first and third nozzle portions N1 and N3. The second nozzle portion N2 is provided as an orifice part protruded in a direction substantially perpendicular to the direction D1 on the side face of the nozzle N. The second nozzle portion N2 serving as the orifice part is provided on a side slightly upstream (on a side of the second opening part OP2) with respect to the center of the nozzle N in the direction D1. The diameter of the second nozzle portion N2 is, for example, about 3 to 10 millimeters.

The third nozzle portion N3 is provided on a gas inflow side and has a diameter larger than that of the second nozzle portion N2 and smaller than that of the first nozzle portion N1. The diameter of the third nozzle portion N3 is, for example, about 5 to 15 millimeters.

Due to provision of the second nozzle portion N2 serving as the orifice part in the middle of the nozzle N, a convection current (a vortex) of the gas is generated in the first nozzle portion N1 immediately after passage through the second nozzle portion N2. However, the flow rate or convection current of the gas is reduced in the first nozzle portion N1 and the convection current near the first opening part OP1 or in the temperature-increase suppression region Rc becomes small.

For example, when the nozzles N have no orifice part and simply have the taper TP as illustrated in FIG. 2, a relatively large convection current (vortex) of the gas is generated near the first opening part OP1. This convection current of the gas may cause heated gas at the lower part in the chamber 10 to flow back (bring up the heated gas) toward the gas supplier 40. Accordingly, the temperature in the temperature-increase suppression region Rc is increased and, when the temperature exceeds the reaction temperature of the source gas, a material film or a dopant adheres to the surface of the gas supplier 40 (near the nozzles N).

On the other hand, the shape of the nozzle N illustrated in FIG. 7 includes the second nozzle portion N2 serving as the orifice part in the middle of the nozzle N and thus the convection current (vortex) of the gas near the first opening part OP1 is suppressed. Therefore, it is possible to suppress heated gas at the lower part in the chamber 10 from flowing back toward the gas supplier 40 as much as possible and to suppress the temperature increase in the temperature-increase suppression region Rc. As a result, a material film or a dopant can be suppressed from adhering to the surface of the gas supplier 40 (near the nozzles N).

Fourth Embodiment

Figure 8:
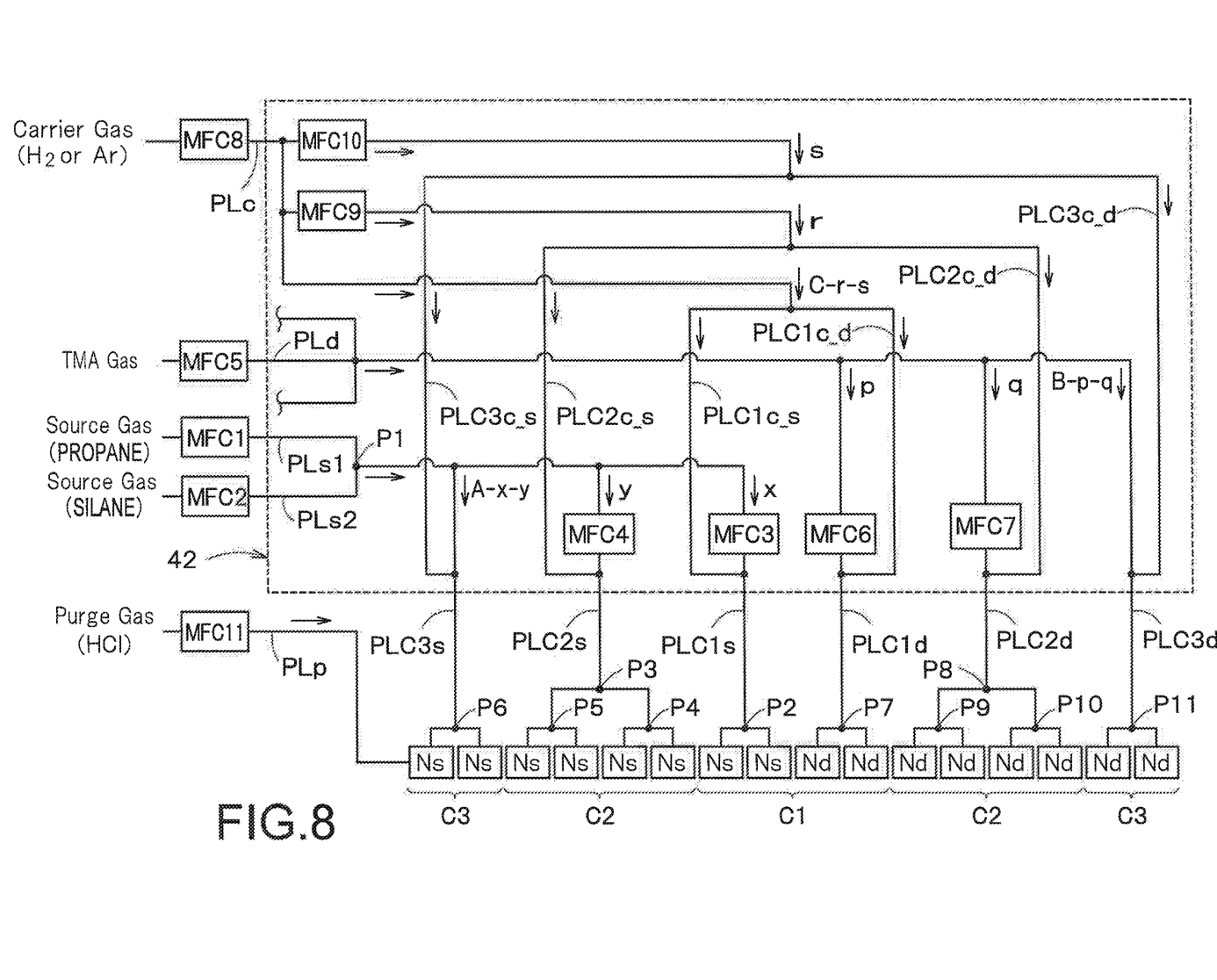
FIG. 8 illustrates a configuration example of a gas supply unit of the gas supplier 40 according to a fourth embodiment.

FIG. 8 illustrates a configuration example of a gas supply unit of the gas supplier 40 according to a fourth embodiment. The gas supply unit supplies the source gas, the doping gas, and the carrier gas to the corresponding nozzles N. Among the nozzles N, nozzles that supply the source gas are denoted by Ns and nozzles that supply the doping gas are denoted by Nd.

The gas supply unit includes pipes that supply the source gas or the doping gas to the nozzles Ns or the nozzles Nd, and mass flow controllers. For example, pipes PLC1$s$ and PLC1$d$ supply the source gas and the doping gas to the nozzles Ns and Nd provided on the concentric circle C1, respectively. Pipes PLC2$s$ and PLC2$d$ supply the source gas and the doping gas to the nozzles Ns and Nd provided on the concentric circle C2, respectively. Pipes PLC3$s$ and PLC3$d$ supply the source gas and the doping gas to the nozzles Ns and Nd provided on the concentric circle C3, respectively.

Source gas lines PLs1 and PLs2 supply the source gas to the pipes PLC1$s$, PLC2$s$, and PLC3$s$. The source gas line PLs1 supplies, for example, propane as one component of the source gas. The source gas line PLs1 supplies the component of the source gas at a predetermined flow rate via a mass flow controller MFC1 serving as a flow rate controller. The source gas line PLs2 supplies, for example, silane as another component of the source gas. The source gas line PLs2 supplies another component of the source gas at a predetermined flow rate via a mass flow controller MFC2. The source gases from the source gas lines PLs1 and PLs2 are mixed at a confluence P1 before being supplied into the chamber 10 and are introduced as a mixture gas into the chamber 10. At this time, for example, silane and propane are measured to have the predetermined flow rates and supplied, respectively, and therefore the mixture gas introduced into the gas supplier 40 also has a predetermined total flow rate.

Mass flow controllers MFC3 and MFC4 that determine the flow rates of the mixture gas are further provided on the pipes PLC1$s$ and PLC2$s$, respectively. Therefore, the pipe PLC1$s$ supplies the mixture gas at the corresponding predetermined flow rate via the mass flow controller MFC3 and the pipe PLC2$s$ supplies the mixture gas at the corresponding predetermined flow rate via the mass flow controller MFC4. Meanwhile, no mass flow controller for the mixture gas is provided on the pipe PLC3$s$. The remaining mixture gas that has not been flowed into the pipes PLC1$s$ and PLC2$s$ flows into the pipe PLC3$s$. Accordingly, for example, when the flow rate of the mixture gas flowing at the confluence P1 is A (slm (standard liter/minute)), the flow rate of the mixture gas flowing into the pipe PLC1$s$ is x (slm), and the flow rate of the mixture gas flowing into the pipe PLC2$s$ is y (slm), the flow rate of the mixture gas flowing into the pipe PLC3$s$ is A-x-y (slm).

The pipe PLC1$s$ has a confluence P2 to divide the mixture gas into the two nozzles (first nozzles) Ns on the concentric circle C1 located on the center side of the gas supplier 40. The mixture gas flowing through the pipe PLC1$s$ is mixed with the carrier gas and then is divided at the confluence P2 to be supplied to the two nozzles Ns on the concentric circle C1.

The pipe PLC2$s$ has confluences P3 to P5 to divide the mixture gas into the four nozzles Ns on the concentric circle C2 located between the concentric circles C1 and C3. The mixture gas flowing through the pipe PLC2$s$ is mixed with the carrier gas and is divided at the confluences P3 to P5 to be supplied to the four nozzles Ns on the concentric circle C2. In this way, the nozzles Ns on the concentric circles C1 and C2 supply the mixture gas at the predetermined flow rates into the chamber 10 using the mass flow controllers MFC3 and MFC4.

The pipe PLC3$s$ has a confluence P6 to divide the mixture gas into the two nozzles (second nozzles) Ns on the concentric circle C3 located on the periphery side of the gas supplier 40. The mixture gas flowing through the pipe PLC3$s$ is mixed with the carrier gas and is then divided at the confluence P6 to be supplied to the two nozzles Ns on the concentric circle C3. In this way, the nozzles Ns on the concentric circle C3 supply the remaining mixture gas that has not been supplied by the nozzles Ns on the concentric circles C1 and C2. This enables the total flow rate of the source gas flowing through the source gas lines PLs1 and PLs2 to be equal to the total flow rate of the source gas flowing through the pipes PLC1$s$ to PLC3$s$. Accordingly, a differential pressure between the source gas lines PLs1 and PLs2 and upstream pipes of the mass flow controllers MFC1 and MFC2 can be easily taken. As a result, stable flow rate control using the mass flow controllers MFC1 and MFC2 can be executed.

A doping gas line PLd supplies the doping gas to pipes PLC1$d$, PLC2$d$, and PLC3$d$. The doping gas line PLd supplies, for example, the TMA gas as the doping gas. The doping gas line PLd supplies the doping gas at a predetermined flow rate via a mass flow controller MFC5. The doping gas from the doping gas line PLd is introduced into the gas supplier 40 via the pipes PLC1d, PLC2d, and PLC3d. Mass flow controllers MFC6 and MFC7 that determine flow rates of the doping gas are provided on the pipes PLC1d and PLC2d, respectively. Therefore, the pipe PLC1d supplies a mixture gas at a predetermined flow rate via the mass flow controller MFC6 and the pipe PLC2d supplies the mixture gas at a predetermined flow rate via the mass flow controller MFC7. Meanwhile, no mass flow controller for the doping gas is provided on the pipe PLC3d. The remaining doping gas that has not been flowed into the pipes PLC1d and PLC2d flows into the pipe PLC3d. Therefore, for example, when the flow rate of the doping gas flowing through the doping gas line PLd is B (slm), the flow rate of the doping gas flowing into the pipe PLC1d is p (slm), and the flow rate of the doping gas flowing into the pipe PLC2d is q (slm), the flow rate of the doping gas flowing into the pipe PLC3d is B-p-q (slm).

Accordingly, the flow rate of the doping gas flowing through the doping gas line PLd can be caused to be equal to the flow rates of the doping gas flowing through the pipes PLC1d to PLCd3. Therefore, a differential pressure between the doping gas line PLd and an upstream pipe of the mass flow controller MFC5 can be easily taken. As a result, stable flow rate control with the mass flow controller MFC5 can be executed.

The pipe PLC1d has a confluence P7 to divide the mixture gas into the two nozzles Nd on the concentric circle C1. The doping gas flowing in the pipe PLCd1 is mixed with the carrier gas and is then divided at the confluence P7 to be supplied to the two nozzles Nd on the concentric circle C1.

The pipe PLC2d has confluences P8 to P10 to divide the mixture gas into the four nozzles Nd on the concentric circle C2. The doping gas flowing in the pipe PLC2d is mixed with the carrier gas and is then divided at the confluences P8 to P10 to be supplied to the four nozzles Nd on the concentric circle C2.

The pipe PLC3d has a confluence P11 to divide the mixture gas into the two nozzles Nd on the concentric circle C3. The doping gas flowing in the pipe PLC3d is mixed with the carrier gas and is then divided at the confluence P11 to be supplied to the two nozzles Nd on the concentric circle C1.

In the fourth embodiment, the doping gas line PLd supplies the TMA gas as the doping gas for P-type SIC. However, the doping gas line PLd can supply a nitrogen gas as a doping gas for N-type SIC.

The carrier gas is supplied to the respective pipes for the mixture gas and the doping gas via a carrier gas supplier 42. The carrier gas supplier 42 has a mass flow controller MFC8 that controls the total rate of the carrier gas on the upstream side and includes pipes PLc, PLC1c_s, PLC2c_s, PLC1c_d, PLC2c_d, and PLC3c_d. The mass flow controller MFC8 controls the flow rate of the carrier gas flowing into the pipe PLc. The pipes PLC1c_s, PLC2c_s, and PLC3c_s supply the carrier gas to the pipes PLC1s, PLC2s, and PLC3s, respectively. The pipes PLC1c_d, PLC2c_d, and PLC3c_d supply the carrier gas to the pipes PLC1d, PLC2d, and PLC3d, respectively.

The carrier gas to be supplied to the nozzles Ns and Nd on the concentric circle C2 is controlled by a mass flow controller MFC9. The carrier gas to be supplied to the nozzles Ns and Nd on the concentric circle C3 is controlled by a mass flow controller MFC10.

Meanwhile, no mass flow controller is provided on a pipe connected to the pipes PLC1c_s and PLC1c_d. Therefore, the remaining carrier gas that has not been flowed into the pipes PLC2c_s, PLC2c_d, PLC3c_s, and PLC3c_d is supplied to the nozzles Ns and Nd on the concentric circle C1. For example, when the flow rate of the carrier gas flowing in the pipe PLc is C (slm), the flow rate of the carrier gas flowing in the pipes PLC2c_s2 and PLC2c_d is r (slm), and the flow rate of the carrier gas flowing in the pipes PLC3c_s and PLC3c_d is s (slm), the flow fate of the carrier gas flowing in the pipes PLC1c_s and PLC1c_d is C-r-s (sim).

In this way, the flow rate of the carrier gas can be changed for each of the concentric circles C1, C2, and C3 of the gas supplier 40. Therefore, the concentrations of the mixture gas and the doping gas can be controlled for each of the concentric circles C1, C2, and C3 of the gas supplier 40. This enables the flow rate of the carrier gas to be controlled with respect to each of regions from the center portion of the substrate W to the periphery portion thereof. That is, the concentrations of the mixture gas and the doping gas can be set for each of the concentric circles C1, C2, and C3.

A periphery purge gas line PLp supplies the purge gas to the periphery portion of the gas supplier 40. For example, an HCl gas is used as the purge gas. The periphery purge gas line PLp supplies the purge gas at a predetermined flow rate via a mass flow controller MFC11. The purge gas from the periphery purge gas line PLp is supplied to the periphery portion of the gas supplier 40 and the inner side face SF12 of the first sidewall part 16. This can suppress an epitaxial film or a dopant from adhering to the outer edge of the gas supplier 40 and the inner side face SF12 of the first sidewall part 16.

As described above, according to the fourth embodiment, the gas supplier 40 mixes a plurality of source gases (silane and propane, for example) in advance and divides the mixture gas into the nozzles Ns to supply the mixture gas into the chamber 10.

If the temperature-increase suppression region Rc is not provided in the chamber 10 and the gas supplier supplies the source gases mixed in advance into the chamber 10, the source gases may be heated near the gas supplier or the nozzles. In this case, the source gases react and adhere as a material film to the gas supplier or the nozzles.

On the other hand, the film forming apparatus 1 according to the fourth embodiment includes the temperature-increase suppression region Rc in the chamber 10. Therefore, even when the gas supplier 40 supplies the mixture gas into the chamber 10, the mixture gas is not heated so much and adhesion of a material film to the gas supplier 40 or the nozzles can be suppressed. This provision of the temperature-increase suppression region Rc in the chamber 10 enables the gas supply unit to mix the source gases in advance and supply the resultant mixture gas into the chamber 10.

In the fourth embodiment, the gas supplier 40 includes the two mass flow controllers MFC3 and MFC4 with respect to the three pipes PLC1s to PLC3s. The gas supplier 40 also includes the two mass flow controllers MFC6 and MFC7 with respect to the three pipes PLC1d to PLC3d. The numbers of the pipes and the mass flow controllers are not limited thereto. For example, the gas supplier 40 can include (n−1) mass flow controllers with respect to n pipes PLC1s to PLC(n)s (n is an integer equal to or larger than 3). At this time, the number n of the pipes PLC1s to PLC(n)s corresponds to the number of the nozzles Ns on the concentric circle C2. Therefore, assuming that the number of the nozzles (first and second nozzles) Ns on the concentric circle C2 is n, the number of mass flow controllers provided for the nozzles Ns on the concentric circle C2 is n−1.

The gas supplier 40 can include (n−1) mass flow controllers for pipes PLC1d to PLC(n)d. This can suppress application of an excessive pressure to the pipes and the mass flow controllers and can suppress back-flow of the source gas and the doping gas. The same holds for a relation between the number of the pipes PLC1d to PLC3d and the number of the mass flow controllers MFC6 and MFC7 for the doping gas.

The carrier gas supplier 42 adds the carrier gas to the mixture gas or the doping gas having passed through the mass flow controllers MFC3, MFC4, MFC6, and MFC7 and controls the flow rate of the carrier gas for each of the concentric circles C1, C2, and C3. Therefore, the concentrations of the mixture gas and the doping gas can be controlled for each of the concentric circles C1, C2, and C3. That is, the flow rate of the carrier gas can be controlled with respect to each of concentric regions from the center portion of the substrate W to the periphery portion thereof. In other words, the gas supplier 40 can change the flow rate of the mixture gas according to the distance from the center of the substrate W.

While the flow rate is controlled using the mass flow controller as the flow rate controller in the above embodiments, a gas line having a mass flow meter and a needle valve attached in series thereto can be used as the flow rate controller.

Two or more of the first to fourth embodiments described above can be arbitrarily combined with one another. When such a combination is made, the film forming apparatus 1 can obtain effects of plural embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A film forming apparatus comprising:
a film forming chamber configured to house therein a substrate to perform film forming processing;
a gas supplier located in an upper part of the film forming chamber and including a nozzle supplying a process gas onto the substrate; and
a heater including an upper heater provided on a side wall of the film forming chamber above the substrate, the heater being configured to heat the substrate, wherein
the film forming chamber has a temperature-increase suppression region being a lower part of the gas supplier and suppressing a temperature increase of the gas supplied to an upper part of the heater,
the temperature-increase suppression region is located below the nozzle,
the heater is located below the temperature-increase suppression region,
the film forming apparatus further comprises a cooler located on a first sidewall part of the film forming chamber around the temperature-increase suppression region, and configured to suppress a temperature increase of the gas in the temperature-increase suppression region using a refrigerant, and
the cooler and the upper heater are separated vertically.

2. The apparatus of claim 1, wherein
an inside diameter of the first sidewall part of the film forming chamber around the temperature-increase suppression region is smaller than that of a second sidewall part of the film forming chamber below the first sidewall part,
the apparatus further comprises a reflector located at a stepped portion between the first sidewall part and the second sidewall part and configured to reflect heat from the heater, and
the reflector is protruded from the first sidewall part toward an inner side of the film forming chamber.

3. The apparatus of claim 2, wherein a step is provided between the first sidewall part and the second sidewall part.

4. The apparatus of claim 1, wherein the gas supplier comprises a plurality of nozzles arranged substantially uniformly in a concentric manner in a plane substantially perpendicular to a gas supply direction.

5. The apparatus of claim 4, wherein nozzles supplying a source gas and nozzles supplying a doping gas among the nozzles are arranged alternately and substantially uniformly in the gas supplier.

6. The apparatus of claim 1, wherein the gas supplier further comprises an orifice portion located on a side face of each of nozzles of the gas supplier and protruded in a direction substantially perpendicular to a gas supply direction.

7. The apparatus of claim 2, wherein the gas supplier further comprises an orifice portion located on a side face of each of nozzles of the gas supplier and protruded in a direction substantially perpendicular to a gas supply direction.

8. The apparatus of claim 1, wherein the gas supplier supplies a mixture gas obtained by mixing in advance at least two out of a plurality of source gases constituting the process gas to the film forming chamber.

9. The apparatus of claim 2, wherein the gas supplier supplies a mixture gas obtained by mixing in advance at least two out of a plurality of source gases constituting the process gas to the film forming chamber.

10. The apparatus of claim 1, wherein
the gas supplier comprises
at least one flow rate controller configured to determine a flow rate of the process gas,
at least one first nozzle each configured to supply the process gas at a predetermined flow rate to the film forming chamber using the flow rate controller, and
a second nozzle configured to supply a remaining part of the process gas not having been supplied to the first nozzle to the film forming chamber.

11. The apparatus of claim 2, wherein
the gas supplier comprises
at least one flow rate controller configured to determine a flow rate of the process gas,
at least one first nozzle each configured to supply the process gas at a predetermined flow rate to the film forming chamber using the flow rate controller, and
a second nozzle configured to supply a remaining part of the process gas not having been supplied to the first nozzle to the film forming chamber.

12. The apparatus of claim 10, wherein when number of the first and second nozzles is n (n is an integer equal to or larger than 2), number of the flow rate controllers provided for the first and second nozzles is n−1.

13. The apparatus of claim 1, wherein the gas supplier changes a flowrate of the process gas according to a distance from a center of the substrate.

14. The apparatus of claim 4, wherein the gas supplier changes a concentration of the process gas for each of concentric circles of the nozzles.

15. The apparatus of claim 5, wherein the gas supplier changes a concentration of the process gas for each of concentric circles of the nozzles.

16. The apparatus of claim 1, wherein a reflector located between the upper heater and the cooler and configured to reflect heat from the upper heater.

\* \* \* \* \*